US011069382B2

(12) United States Patent
Lan et al.

(10) Patent No.: US 11,069,382 B2
(45) Date of Patent: Jul. 20, 2021

(54) TOOL-FREE HARD DISK BRACKET

(71) Applicant: MITAC COMPUTING TECHNOLOGY CORPORATION, Taoyuan (TW)

(72) Inventors: Chih-Chang Lan, Taoyuan (TW); Hung-Yu Chen, Taoyuan (TW); Chun-Liang Chen, Taoyuan (TW); Wei-Hsiang Peng, Taoyuan (TW); Jian-Hua Chen, Taoyuan (TW)

(73) Assignee: MITAC COMPUTING TECHNOLOGY CORPORATION, Taoyuan (TW)

(*) Notice: Subject to any disclaimer, the term of this patent is extended or adjusted under 35 U.S.C. 154(b) by 88 days.

(21) Appl. No.: 16/673,420

(22) Filed: Nov. 4, 2019

(65) Prior Publication Data
US 2020/0143845 A1   May 7, 2020

(30) Foreign Application Priority Data

Nov. 7, 2018 (TW) .................................. 107139435

(51) Int. Cl.
| H05K 7/00 | (2006.01) |
| G11B 33/02 | (2006.01) |
| F16M 13/02 | (2006.01) |
| H05K 7/14 | (2006.01) |
| H05K 7/16 | (2006.01) |

(52) U.S. Cl.
CPC ........... *G11B 33/022* (2013.01); *F16M 13/02* (2013.01); *H05K 7/1415* (2013.01); *H05K 7/16* (2013.01)

(58) Field of Classification Search
CPC ...... G11B 33/022; H05K 7/1415; H05K 7/16; H05K 7/1489; F16M 13/02

USPC .......... 248/544; 361/679.32, 679.33, 679.37, 361/679.4, 679.41, 679.43, 679.44, 728, 361/732
See application file for complete search history.

(56) References Cited

U.S. PATENT DOCUMENTS

| 9,600,031 B2 * | 3/2017 | Kaneko ................... E05C 19/10 |
| 2020/0260606 A1 * | 8/2020 | Watanabe ............ H05K 7/1415 |
| 2021/0068297 A1 * | 3/2021 | Xu ........................ H05K 7/1411 |

FOREIGN PATENT DOCUMENTS

| TW | I553634 B | 10/2016 |
| TW | I631557 B | 8/2018 |

OTHER PUBLICATIONS

Search Report regarding Taiwanese Patent Application No. 107139435 dated Oct. 17, 2019, 2 pages.

* cited by examiner

*Primary Examiner* — Todd M Epps
(74) *Attorney, Agent, or Firm* — Brinks Gilson & Lione

(57) ABSTRACT

A tool-free hard disk bracket includes a base having abase body with a guide groove, and an engaging member connected to the base body. A frame includes a first side arm movably engaging with the engaging member. A handgrip is rotatably connected to one end of the base body. An operating unit includes an operating member releasably engaging with the handgrip and having a rotating shaft portion inserted rotatably and movably into the guide groove. The operating member is operated to rotate and release engagement with the handgrip, and is further operated to move along the guide groove toward the engaging member to push the engaging member to pivot and release engagement with the first side arm.

12 Claims, 15 Drawing Sheets

TOOL-FREE HARD DISK BRACKET

CROSS-REFERENCE TO RELATED APPLICATION

This application claims priority to Taiwanese Patent Application No. 107139435, filed on Nov. 7, 2018.

FIELD

The disclosure relates to a hard disk bracket, more particularly to a tool-free hard disk bracket that can be easily operated.

BACKGROUND

An existing hard drive bracket for holding a hard disk has a push button, a handgrip and a frame. The push button is usually engaged with the handgrip. The user presses the push button to disengage the push button from the handgrip, so that the handgrip can be pivoted and popped out for the user to grip. As such, the hard disk bracket can be easily installed in or removed from a server. However, because the hard disk is fixed in the frame through a locking method, it is necessary to use a tool to unlock and then remove the hard disk from the frame. Use of the existing hard drive bracket is inconvenient.

SUMMARY

Therefore, an object of the disclosure is to provide a tool-free hard disk bracket that can alleviate at least one of the drawbacks of the prior art.

Accordingly, a tool-free hard disk bracket of this disclosure for holding a hard disk which has two opposite lateral sides includes a base, a frame, a handgrip and an operating unit. The base includes a base body formed with at least one guide groove, and an engaging member flexibly connected to the base body. The frame is connected to the base for holding the hard disk, and includes a first side arm movably engaging with the engaging member and configured to abut against one of the lateral sides of the hard disk, and a second side arm connected to the base body and configured to abut against the other one of the lateral sides of the hard disk. The handgrip is rotatably connected to one end of the base body, and is located opposite to the frame in a front-rear direction. The handgrip has a pivot end. The operating unit includes an operating member that is movably connected to the base body opposite to the pivot end of the handgrip and that releasably engages with the handgrip. The operating member has at least one rotating shaft portion inserted rotatably and movably into the at least one guide groove. The operating member is operated to rotate with the at least one rotating shaft portion serving as its fulcrum in a direction toward another end of the base body opposite to the one end of the base body that is connected with the handgrip to release engagement with the handgrip, and is further operated to move along the at least one guide groove toward the engaging member to push the engaging member to pivot and release engagement with the first side arm.

BRIEF DESCRIPTION OF THE DRAWINGS

Other features and advantages of the present disclosure will become apparent in the following detailed description of the embodiments with reference to the accompanying drawings, of which.

DETAILED DESCRIPTION

Figure 1:
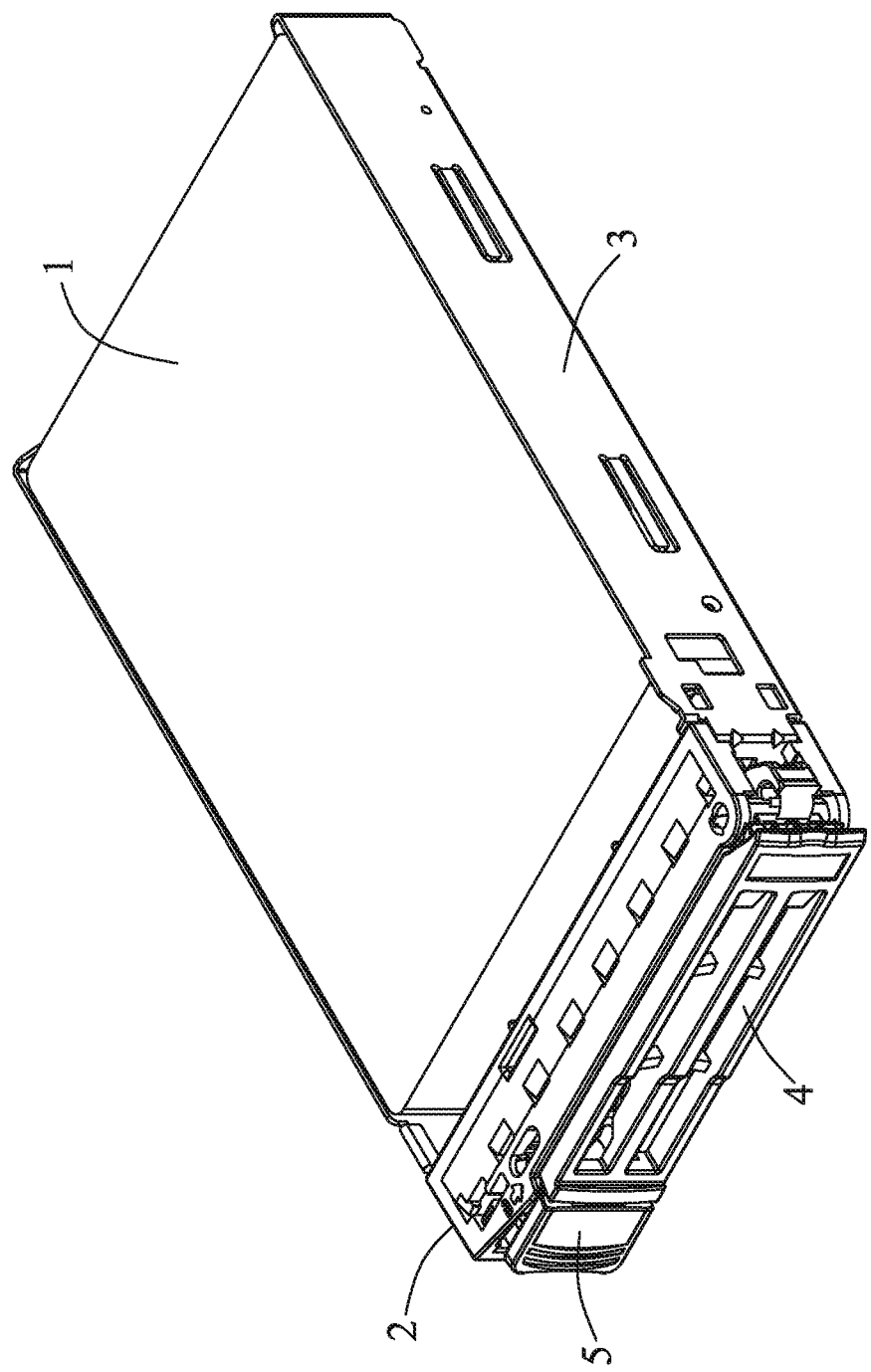
FIG. 1 is a perspective view of a tool-free hard disk bracket according to the first embodiment of the present disclosure.
Figure 2:
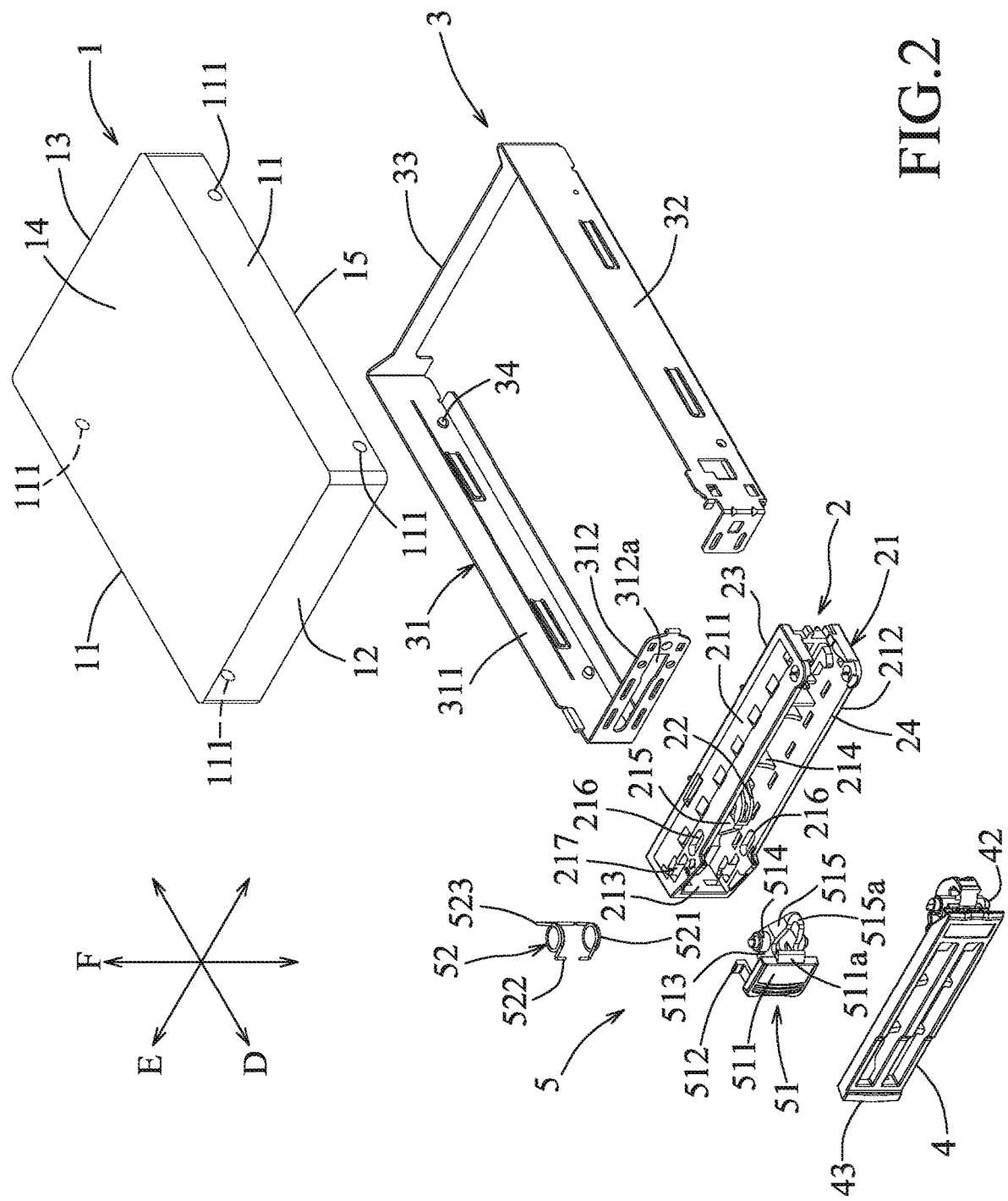
FIG. 2 is an exploded perspective view of the first embodiment.
Figure 3:
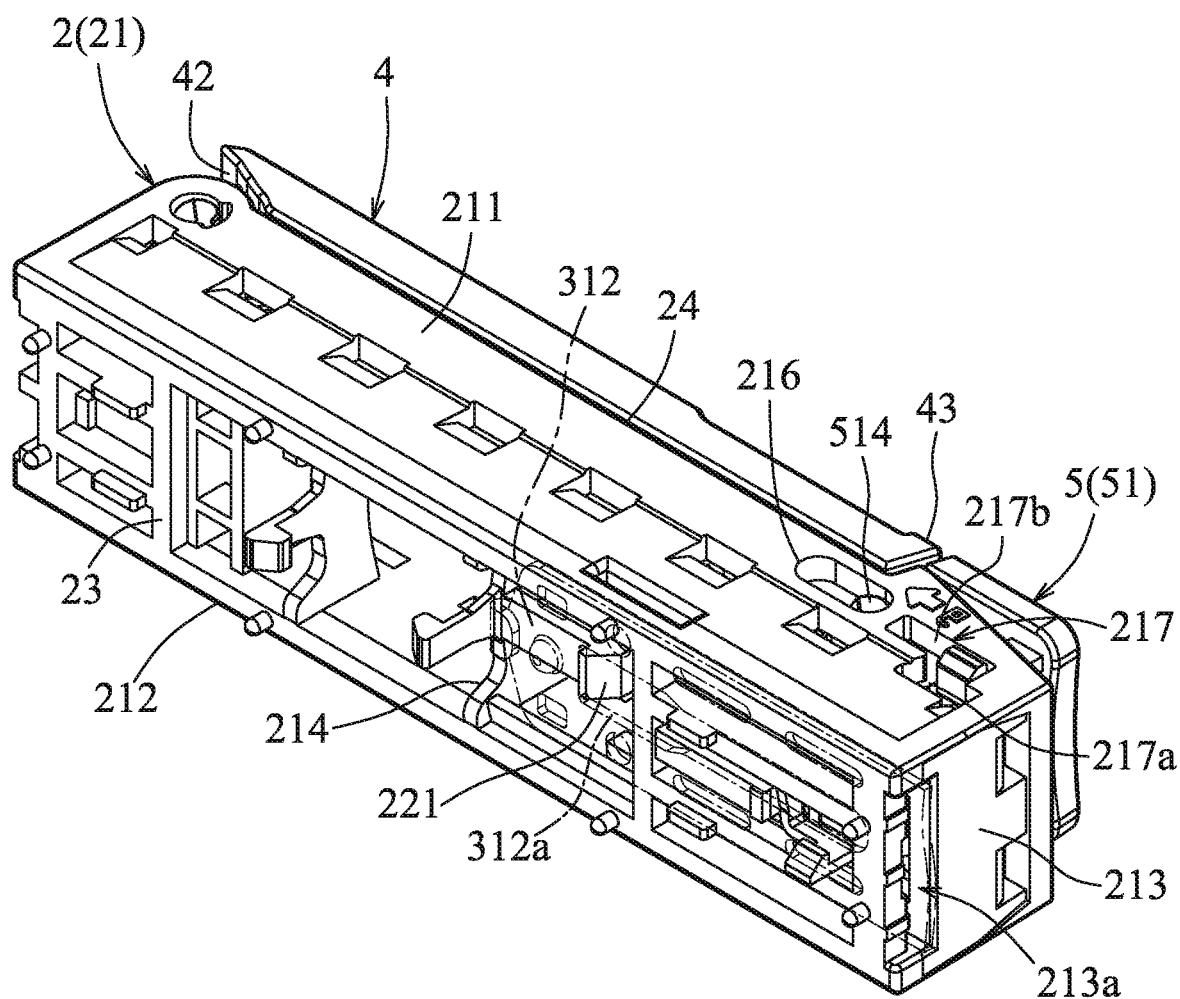
FIG. 3 is a perspective view of the first embodiment, but with a frame and a hard disk omitted.
Figure 4:
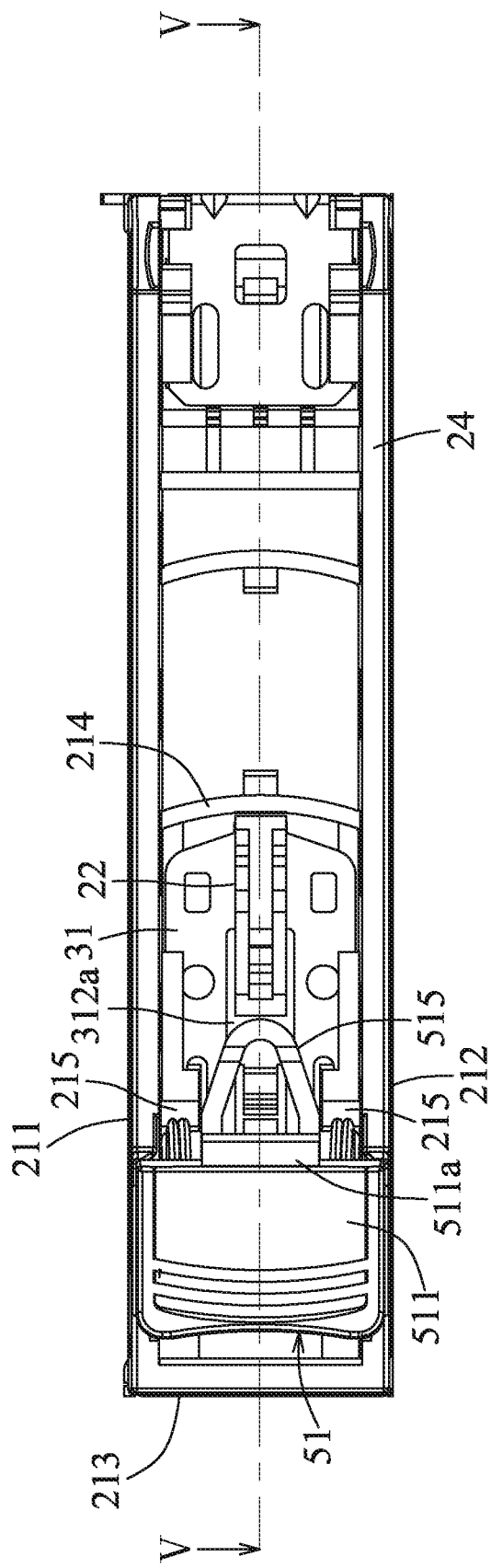
FIG. 4 is a front view of the first embodiment, but with a handgrip omitted.

Before the present disclosure is described in greater detail with reference to the accompanying embodiments, it should be noted herein that like elements are denoted by the same reference numerals throughout the disclosure.

Referring to FIGS. 1 to 6, a tool-free hard disk bracket according to the first embodiment of the present disclosure is suitable for holding a hard disk 1 which has opposite left and right lateral sides 11, opposite front and rear sides 12, 13, and opposite top and bottom surfaces 14, 15. Each lateral side 11 of the hard disk 1 is provided with a plurality of positioning holes 111. The hard drive bracket of this disclosure is a carrier for mounting the hard disk 1 to a server system (not shown), so that installation and removal of the hard disk 1 to and from the server system can be facilitated. The tool-free hard disk bracket of this disclosure comprises a base 2, a frame 3, a handgrip 4 and an operating unit 5.

Figure 6:
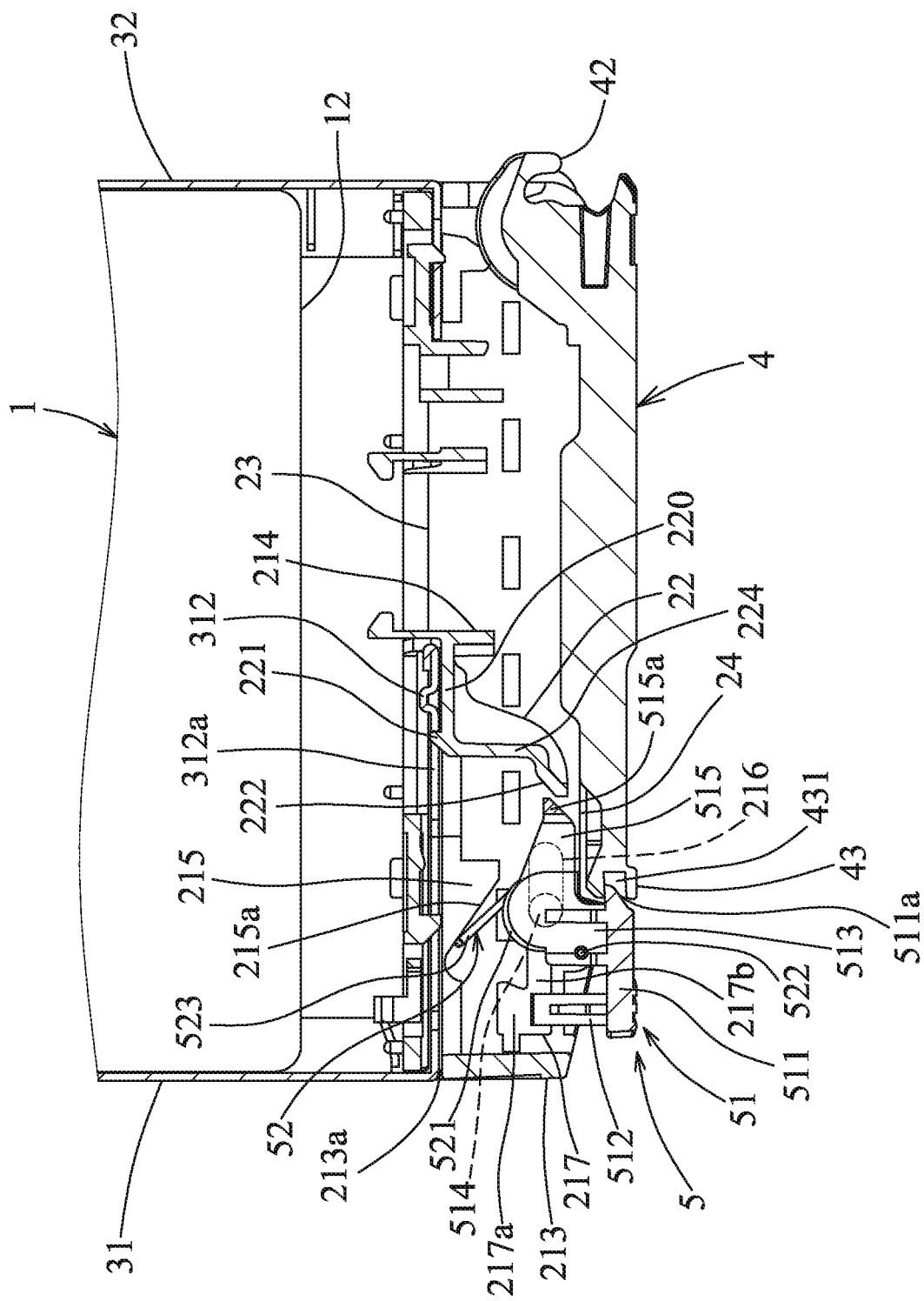
FIG. 6 is a fragmentary enlarged sectional view of FIG. 5.

The base 2 includes a base body 21 and an engaging member 22. The base body 21 extends in a left-right direction (E) transverse to the lateral sides 11 of the hard disk 1, and includes a first main wall 211 generally parallel to the top surface 14 of the hard disk 1, a second main wall 212 opposite to the first main wall 211 in a top-bottom direction (F) transverse to the left-right direction (E) and generally parallel to the bottom surface 15 of the hard disk 1, an end wall 213 connecting one end of the first main wall 211 to a corresponding one end of the second main wall 212, and a connecting wall 214 connected between central portions of the first and second main walls 211, 212. The base 2 has a rear side 23 facing the hard disk 1, and a front side 24 distal to the hard disk 1. Each of the first and second main walls 211, 212 is formed with a guide groove 216 located between the end wall 213 and the connecting wall 214, an engaging groove 217 spaced apart from the guide groove 216 and proximate to the end wall 213, and a stop block 215 proximate to the guide groove 216. The guide grooves 216 of the first and second main walls 211, 212 correspond in position to each other, and extend in the left-right direction (E) similar to that of the base body 21. The engaging grooves 217 of the first and second main walls 211, 212 also correspond in position to each other. As shown in FIG. 6, each engaging groove 217 has a generally L-shape, and includes a first hole section (217a) extending in a front-rear direction (D) transverse to the left-right direction (E) and the top-bottom direction (F), and a second hole section (217b) extending from a front end of the first hole section (217a) toward the guide groove 216. The second hole section (217b) extends in the left-right direction (E) similar to that of the base body 21. The stop blocks 215 of the first and second main walls 211, 212 are located between the first and second main walls 211, 212, and face each other. Each stop block 215 has an inclined stop face (215a) extending inclinedly toward the end wall 213 and the hard disk 1.

Figure 5:
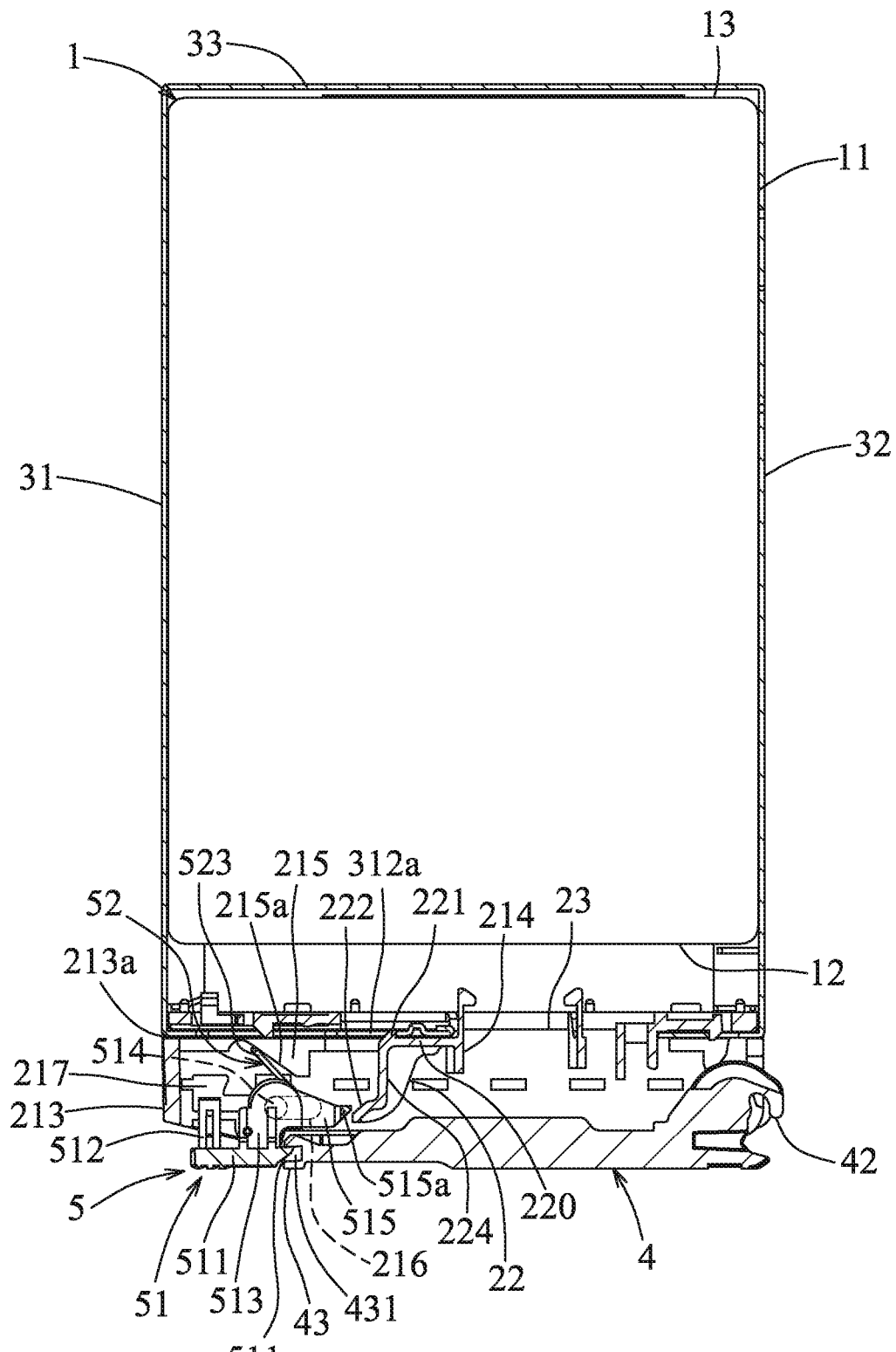
FIG. 5 is a sectional view of the first embodiment taken along line V-V of FIG. 4.
Figure 10:
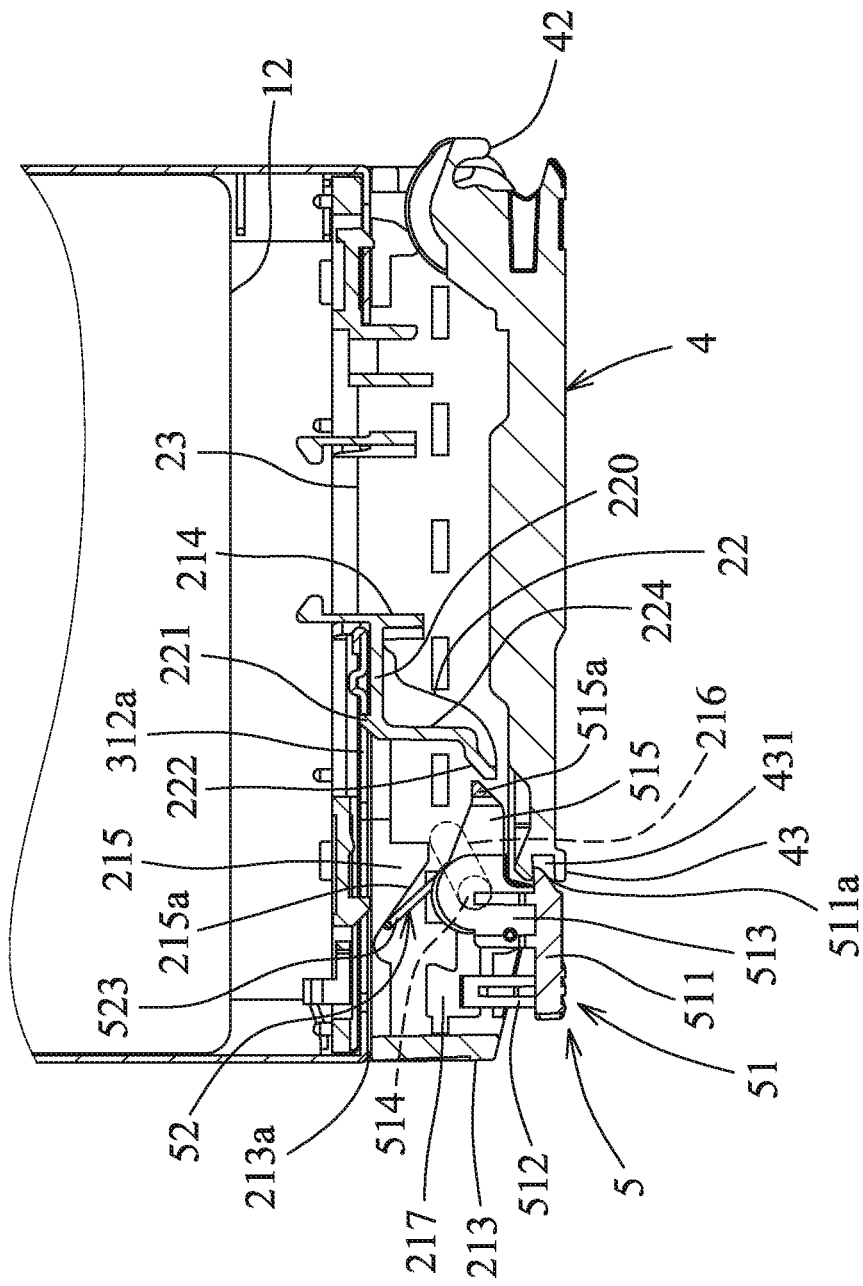
FIG. 10 is a view similar to FIG. 9, but illustrating an alternative form of the first side arm.
Figure 11:
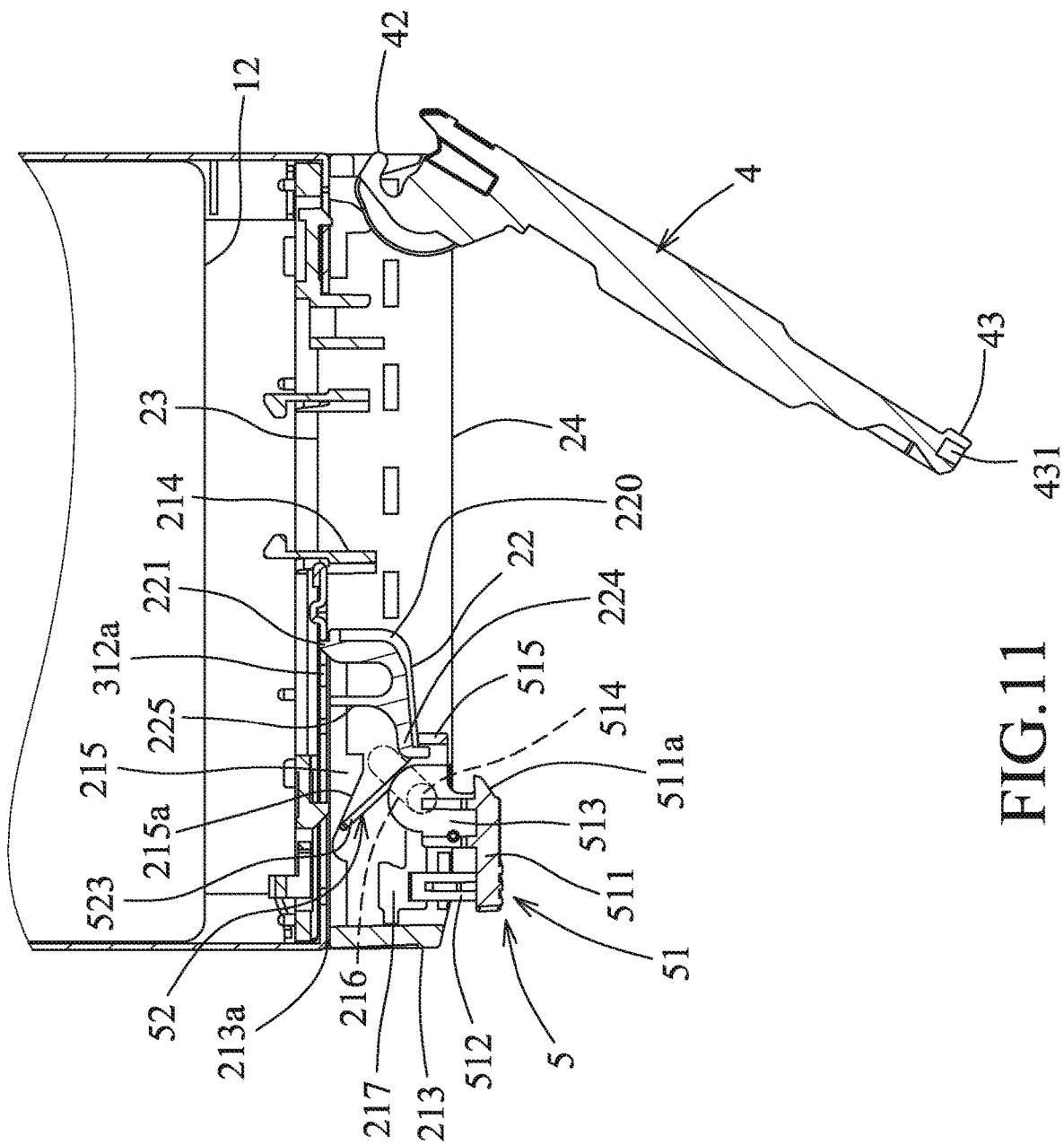
FIG. 11 illustrates an alternative form of a guide groove of the base body of the first embodiment.

In this embodiment, the engaging member 22 is integrally connected as one piece with the base body 21, but is not limited thereto. As shown in FIGS. 5 and 6, the engaging member 22 is flexibly connected to the connecting wall 214, and has a generally L-shaped elastic arm structure which includes a first arm section 220 connected to the connecting wall 214, and a second arm section 224 extending forwardly and transversely from one end of the first arm section 220. The engaging member 22 has an inclined first abutment surface 222 provided on one end of the second arm section 224 that is opposite to the first arm section 220 and facing the end wall 213, and an engaging hook 221 extending from a junction of the first and second arm sections 220, 224 toward the hard disk 1 and facing the rear side 24 of the base body 21 for engagement with the frame 3. In other embodiments, the disposition of the stop blocks 215 may differ from the aforesaid disclosure, the guide grooves 216 may not extend in a direction similar to that of the base body 21, and the number of the stop block 215 may be one which is connected to the first main wall 211, the second main wall 212 and the end wall 213. Further, each guide groove 216 may be inclined in a direction away from the hard disk 1 with respect to the extending direction of the base body 21, as shown in FIGS. 10 and 11, and the engaging member 22 may be pivoted between the first and second main walls 211, 212, as long as the engaging member 22 can be pivoted.

The frame 3 is connected to the rear side 23 of the base 2 for holding the hard disk 1, and includes a first side arm 31, a second side arm 32, and a cross arm 33 interconnecting corresponding ends of the first and second side arms 31, 32. The first side arm 31 is movably engaged with the engaging member 22, and abuts against a corresponding one of the lateral sides 11 of the hard disk 1. Specifically, the first side arm 31 is provided with a plurality of positioning protrusions 34 corresponding in number to the positioning holes 111 and respectively engaging with the same. In this embodiment, the first side arm 31 includes a first segment 311 and a second segment 312 connected to each other to form an L-shaped body. The first segment 311 is provided with the positioning protrusions 34. When the first side arm 31 abuts against the corresponding lateral side 11 of the hard disk 1, the positioning protrusions 34 of the first side arm 31 respectively engage the positioning holes 111 in the corresponding lateral side 11. The second segment 312 is formed with a retaining slot (312a). The engaging hook 221 of the engaging member 22 extends into the retaining slot (312a) to releasably engage the engaging member 22 and the first side arm 31 to each other.

The second side arm 32 is also provided with a plurality of positioning protrusions similar to the positioning protrusions 34 of the first side arm 32 for respective engagement with the positioning holes 111 in the other lateral side 11 of the hard disk 1 when the second side arm 32 abuts against the lateral side 11. The cross arm 33 abuts against the rear side 13 of the hard disk 1. The end wall 213 is formed with an insert groove (213a) (see FIG. 3) proximate to the rear side 23 of the base body 21 for insertion of the second segment 312 of the first side arm 31 therein, so that the second segment 312 can engage with the engaging hook 221 through the retaining slot (312a).

The handgrip 4 is rotatably connected to one end of the base body 21 that is opposite to the end wall 213, and is located at the front side 24 of the base 2. In this embodiment, the handgrip 4 is a substantially elongated plate, and has a pivot end 42 and an engaging end 43. The pivot end 42 is pivoted to the one end of the base body 21, and is located between the first and second main walls 211, 212. The engaging end 43 is opposite to the pivot end 42, faces the end wall 213, and is formed with a notch 431 extending inwardly from an end surface thereof. The handgrip 4 is used for gripping by a user when the user installs or removes the tool-free hard disk bracket in or from the server system.

The operation unit 5 is disposed on another end of the base body 21 which is opposite to the pivot end 42 of the handgrip 4. In this embodiment, the operating unit 5 includes an operating member 51 and a resilient member 52. The operating member 51 is movably connected to the base body 21 in proximity to the end wall 213, and releasably engages with the handgrip 4. The operating member 51 has an operating portion 511, two engaging portions 512 extending respectively from two opposite sides of the operating portion 511 toward the first side arm 31, two connecting portions 513 extending respectively from the operating portion 511 toward the first side arm 31 and spaced apart from the engaging portions 512, two rotating shaft portions 514 respectively extending from the connecting portions 513 into the respective guide grooves 216 of the first and second main walls 211, 212, and a pushing portion 515 connected between the connecting portions 513.

The operating portion 511 is a rectangular plate, and has a protruding block (511a) engaged with the notch 431 in the engaging end 43 of the handgrip 4. The engaging portions 512, the connecting portions 513, the rotating shaft portions 514 and the pushing portion 515 are all located on the side of the operating portion 511 that faces the base body 21. The engaging portions 512 respectively extend into the engaging grooves 217 to prevent rotation of the operating member 51 in a direction away from the base body 21 with the rotating shaft portions 514 serving as its fulcrum. The rotating shaft portions 514 extend rotatably and movably into the respective guide grooves 216. The pushing portion 515 has a generally V-shaped structure, and has two opposite ends respectively connected to the connecting portions 513. Such a design can save material costs during forming. The pushing portion 515 further has an inclined second abutment surface (515a) opposite to the two ends thereof and abuttable against the first abutment surface 222.

In this embodiment, the resilient member 52 is a torsion spring that has two coiled portions 521 respectively sleeved on the rotating shaft portions 514 of the operating member 51, two fixed ends 522 respectively extending from the coiled portions 521 and respectively fixed to the connecting portions 513, and two abutment ends 523 (only one is visible in FIG. 2) respectively extending from the coiled portions 521 opposite to the fixed ends 522 and respectively abutting against the inclined stop faces (215a) of the stop blocks 215. The number of each of the guide groove 216, the rotating shaft portion 514, the engaging portion 512 and the engaging groove 217 is not limited to two, and may be one in other embodiments. The guide groove 216 and the engaging groove 217 may be formed in one of the first and second main walls 211, 212.

Figure 7:
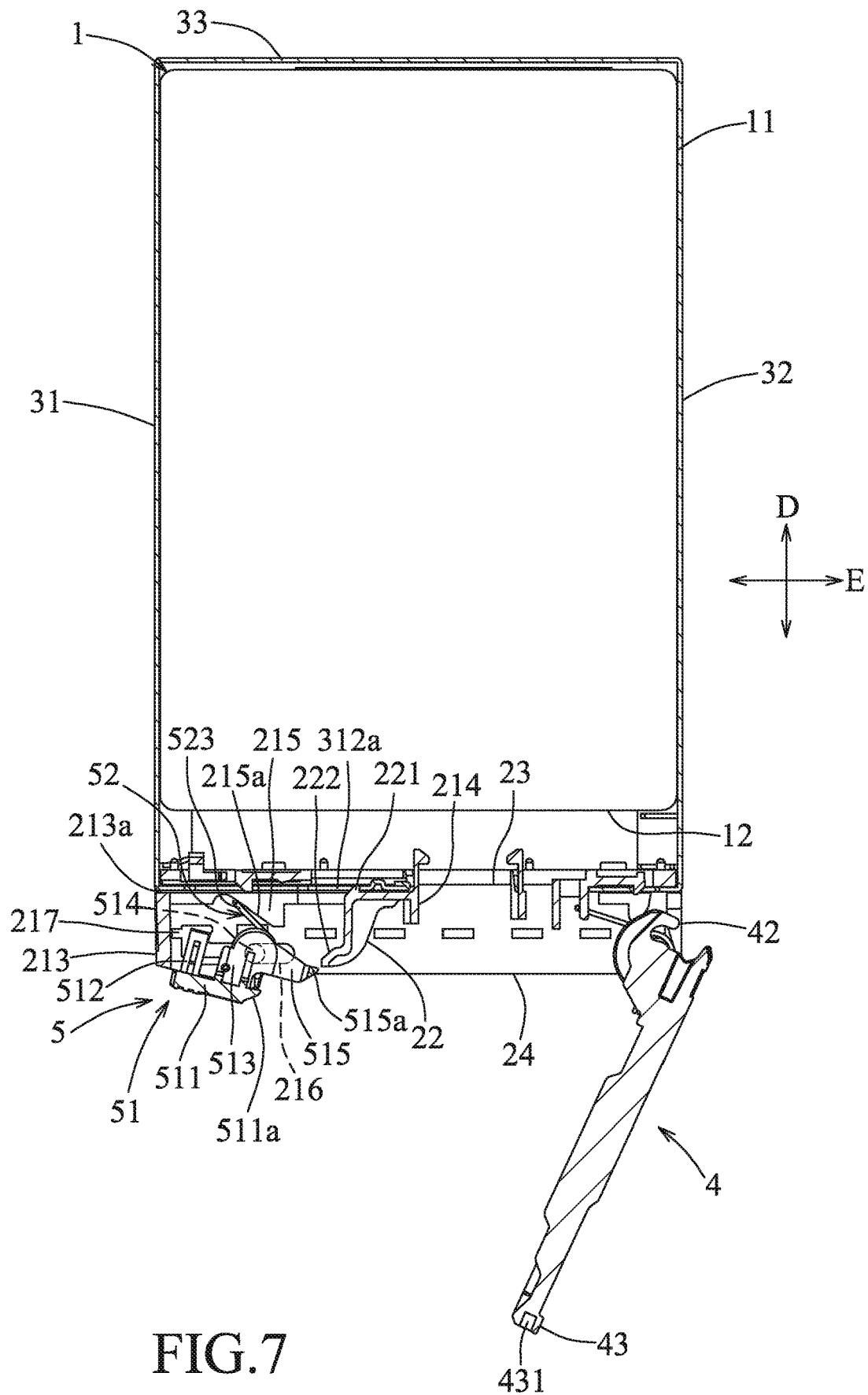
FIG. 7 is a view similar to FIG. 5, but with an operating member being rotated to release engagement with the handgrip.

Referring to FIG. 7, in combination with FIGS. 5 and 6, to use the tool-free hard disk bracket of this disclosure, the operating portion 511 of the operating member 51 is first pressed by a user. Since the first hole sections (217a) of the engaging grooves 217 extend in the front-rear direction (D), the engaging portions 512 of the operating member 51 are allowed to move in the respective first hole sections (217a) in the front-rear direction (D). Thus, when the operating portion 511 is pressed by the user, it rotates with the rotating shaft portions 514 serving as its fulcrum until it abuts against front edges of the first and second main walls 211, 212 which are proximate to the handgrip 4, so that the protruding block (511a) of the operating portion 511 can be disengaged from the notch 431 of the handgrip 4, thereby releasing engagement between the operating member 51 and the handgrip 4. At this time, the handgrip 4 can be rotated forwardly in a direction away from the base 2.

In this embodiment, the handgrip 4 has a spring (not shown) sleeved on a rotary shaft of the base body 21. When the operating member 51 and the handgrip 4 are engaged to each other, the spring of the handgrip 4 is in a compressed state. When the protruding block (511a) is disengaged from the notch 431, the resilient restoring force of the spring of the handgrip 4 will drive the handgrip 4 to rotate away from the base 2. However, in other embodiments where there is no spring designed on the handgrip 4, the user can manually pull the handgrip 4 to rotate away from the base 2 after pressing the operating member 51. With the provision of the resilient member 52, during rotation of the operating member 51 to abut against the front edges of the first and second main walls 211, 212, the resilient member 52 is compressed to provide a restoring force for restoring the operating member 51 to its original non-operating position.

Figure 8:
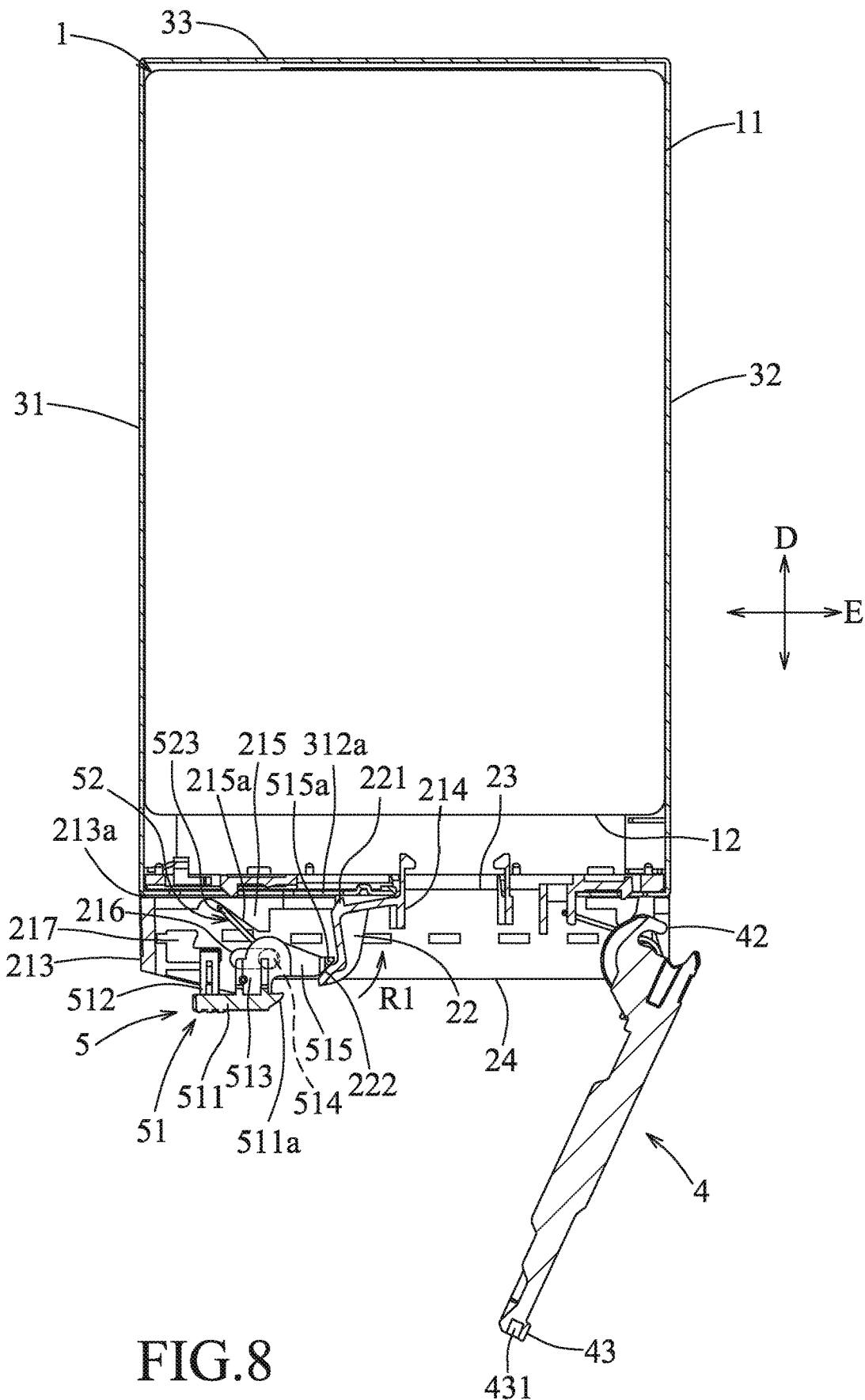
FIG. 8 is a view similar to FIG. 5, but with the operating member being moved toward an engaging member to release engagement between the engaging member and a first side arm of the frame.
Figure 9:
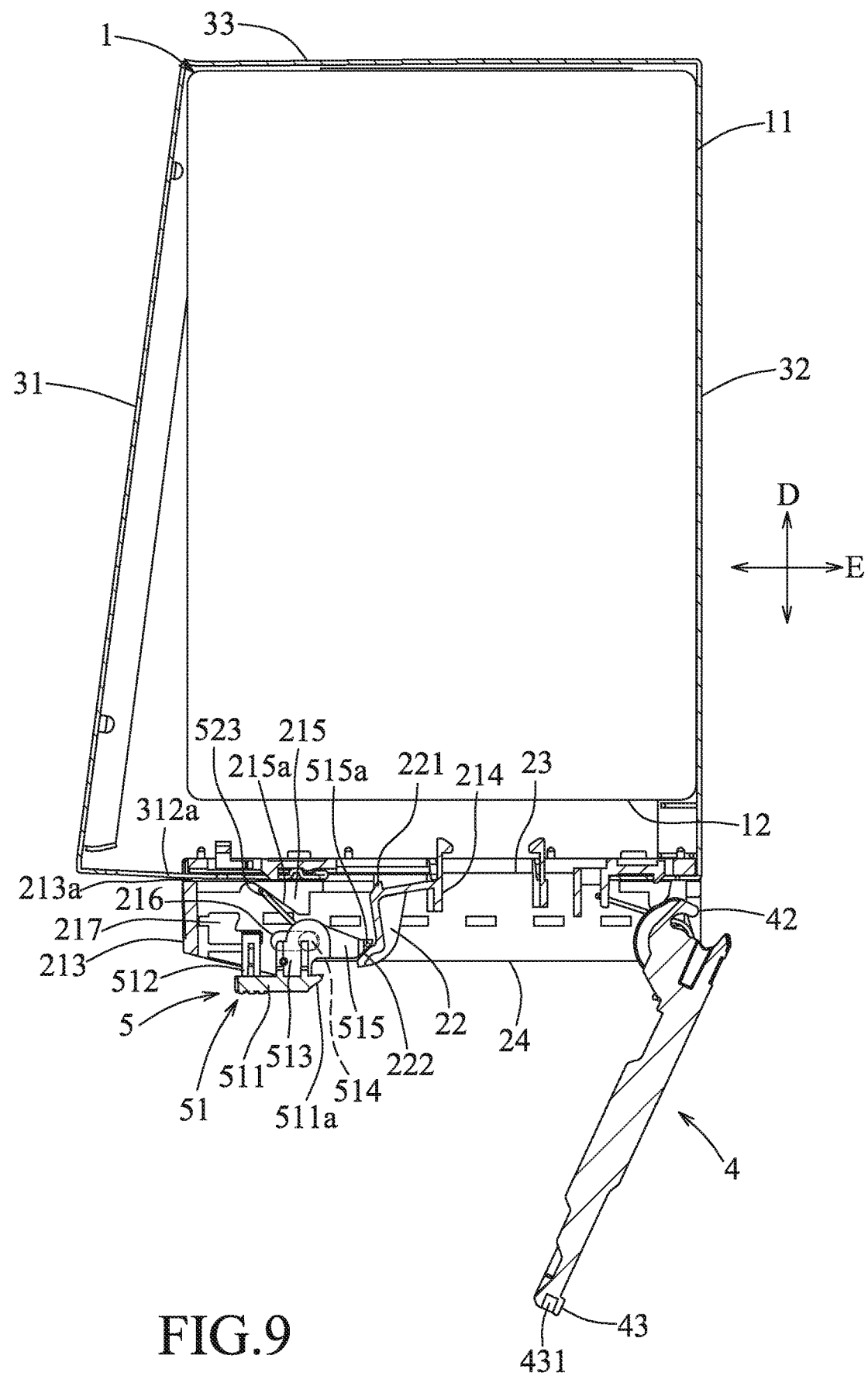
FIG. 9 is a view similar to FIG. 5, but with the first side arm being moved away from a base body of a base.

Referring to FIGS. 8 and 9, the user can further operate the operating member 51 by pushing the operating portion 511 to move along the guide grooves 216 through the rotating shaft portions 514 toward the engaging member 22 until the first abutment surface 222 abuts against the second abutment surface (515a). Since the second hole sections (217b) of the engaging grooves 217 extend in the left-right direction (E), the engaging portions 512 are allowed to move in the respective second hole sections (217b) in the left-right direction (D). Through the abutment of the first abutment surface 222 with the second abutment surface (515a), when the pushing portion 515 is pushed against the first abutment surface 222 of the engaging member 22, a force is applied to drive the first abutment surface 222 of the engaging member 22 to move in a direction away from the base 2, and a torque is generated to the fulcrum (the first arm section 220 of the engaging member 22 that is connected to the connecting wall 214), so that the engaging member 22 will rotate in a first pivot direction (R1) (a counterclockwise direction in FIG. 8) to drive the engaging hook 221 to disengage from the retaining slot (312a) in the first side arm 31, thereby releasing engagement between the engaging member 22 and the first side arm 31, as shown in FIG. 8. As such, the first side arm 31 can be moved relative to the hard disk 1 between an abutting position and a non-abutting position. That is, the second segment 312 of the first side arm 31 is movable relative to the insert groove (213a), so that the first side arm 31 can be moved relative to the hard disk 1 between the abutting and non-abutting positions.

In the abutting position, the first side arm 31 abuts stably against the corresponding lateral side 11 of the hard disk 1 with the positioning protrusions 34 of the first side arm 31 extending into the respective positioning holes 111 in the corresponding lateral side 11, and is engaged with the engaging member 22, as shown in FIG. 8. When the operating member 51 is operated to disengage the engaging hook 221 from the retaining slot (312a), the user can then pull the first segment 311 of the first side arm 31 to move in a direction away from the base body 21 so as to increase the distance between the second segment 312 of the first side arm 31 and the second side arm 32, thereby switching the first side arm 31 toward the non-abutting position, in which the first side arm 31 no longer abuts stably against the corresponding lateral side 11 of the hard disk 1. That is, the positioning protrusions 34 of the first side arm 31 are moved away from the respective positioning holes 111 in the corresponding lateral side 11, and the first side arm 31 is disengaged from the engaging member 22, so that the hard disk 1 can be separated and removed from the frame 3 by the user, as shown in FIG. 9.

Through the resilient member 52, during movement of the operating member 51 along the guide grooves 216 toward the engaging member 22, the resilient member 52 is compressed to provide a restoring force to restore the operating member 51 to its original non-operating position. After the operating member 51 returns to its original position, the engaging member 22, by virtue of its own resilient restoring force, can also return to its initial position in which it engages the first side arm 31. Thus, the engaging member 22 of this embodiment acts similar to a flexible arm, and can be pushed to disengage with the first side arm 31. When the pushing force on the engaging member 22 is released, the engaging member 22 returns to its engaging state with the first side arm 31. In other embodiments, the resilient member 52 may not be provided, but, after operating the operating member 51, the user must manually move the operating member 51 to return to its original position.

It should be noted herein that, in other embodiments, the first abutment surface 222 and the second abutment surface (515a) do not need to be inclined, it is only necessary that the first abutment surface 222 faces the pushing portion 515. When the pushing portion 515 pushes the engaging member 22, it can similarly apply a force to drive the engaging member 22 to move in a direction away from the base 2 and generate a torque to the fulcrum (one end of the engaging member 22 that is connected to the connecting wall 214), so that the engaging member 22 will rotate in a first pivot direction (R1). Further, if the guide groove 216 is inclined with respect to the extending direction of the base body 21 in other embodiments, through the cooperation of the first and second abutment surfaces (222, 515a), the same foregoing effect can be achieved.

Figure 12:
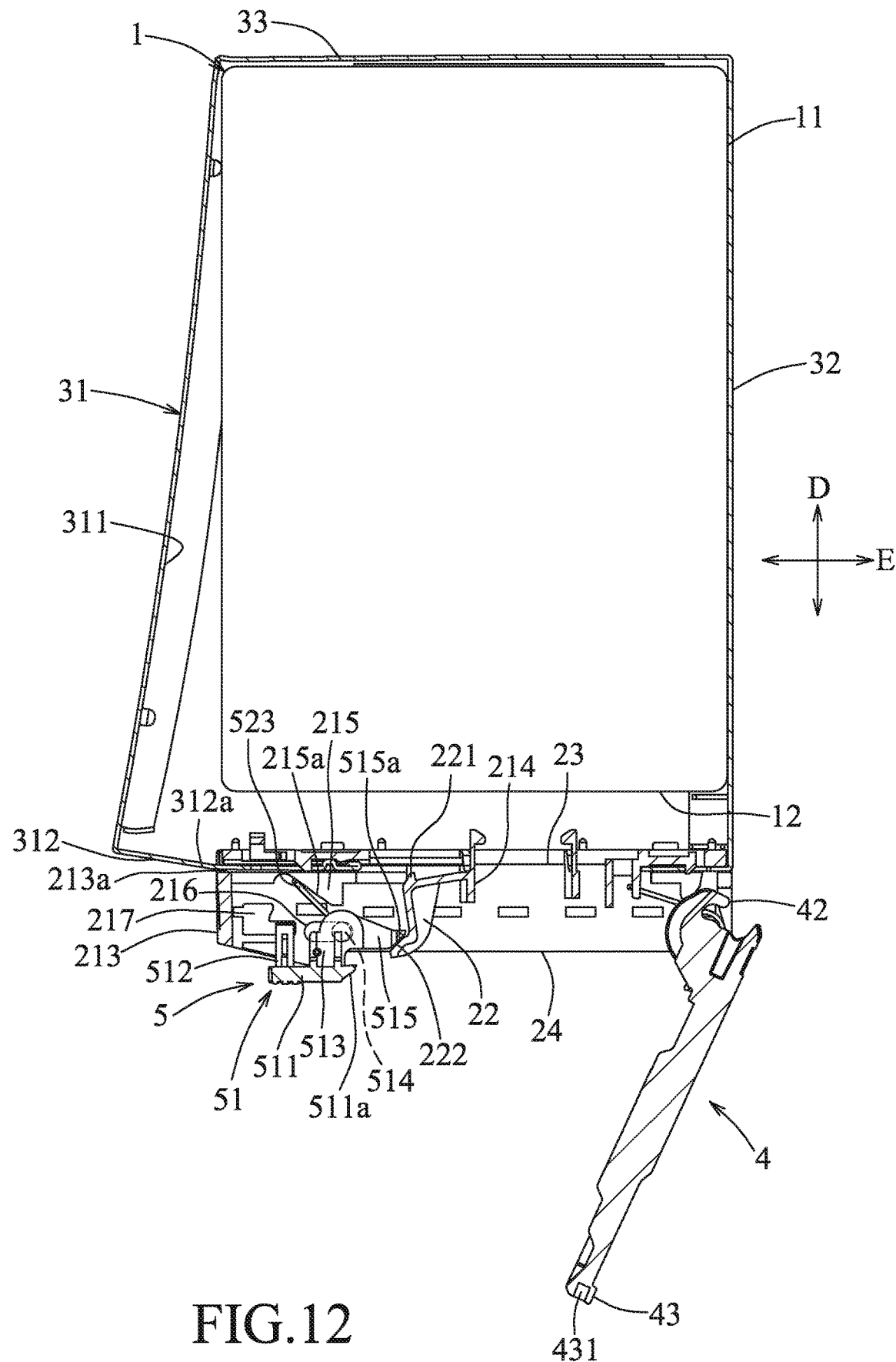
FIG. 12 is a view similar to FIG. 11, but with an operating member being rotated to release engagement with the handgrip.

In another embodiment, as shown in FIG. 12, the first segment 311 of the first side arm 31 of the frame 3 may be curved. In this case, when the second segment 312 of the first side arm 31 is engaged with the engaging member 22, the first side arm 31 is elastically deformed, and stores a resilient restoring force. When the operating member 51 is operated to disengage the engaging member 22 and the first side arm 31 from each other, the first side arm 31 will move away from the base body 21 through its resilient restoring force. In yet another embodiment, when the operating member 51 is operated to disengage the engaging member 22 and the first side arm 31 from each other, the first side arm 31 may be pulled by an external force, for example, by a user's hand, to resiliently deform and move relative to the hard disk 1 in a direction away from the base body 21; and when the pulling force is released, the first side arm 31 will move toward the hard disk 1 through its resilient restoring force, and return to its position in which it engages with the engaging member 22.

Figure 13:
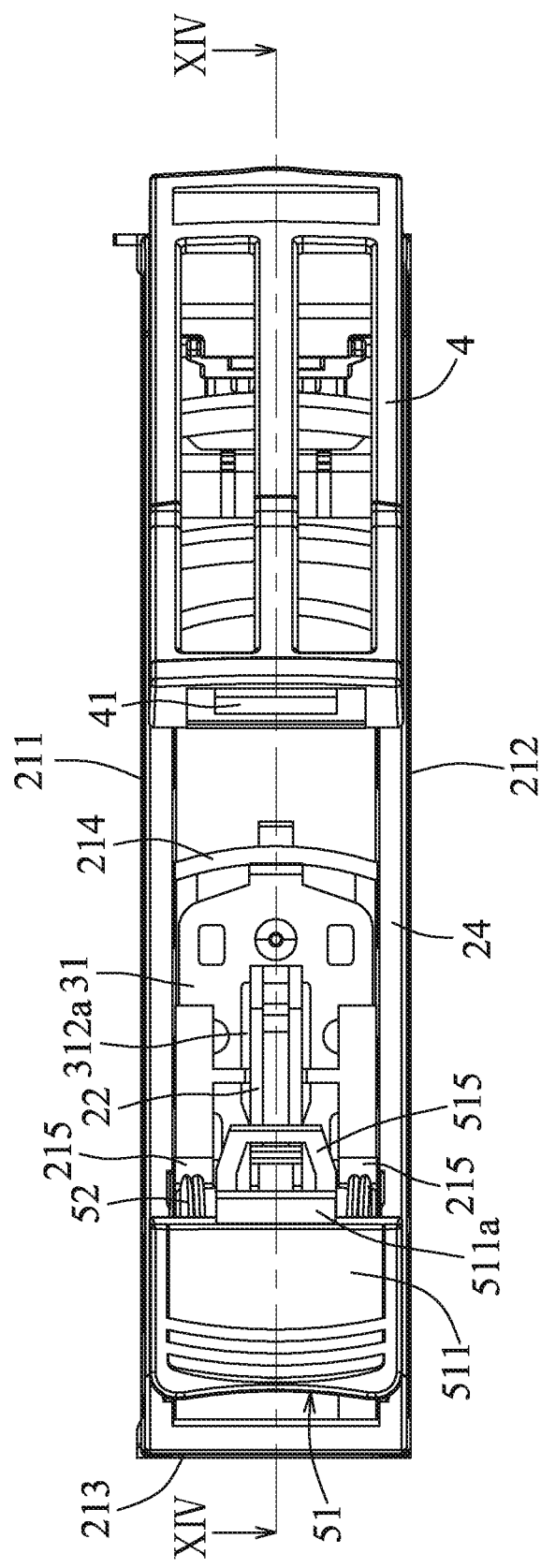
FIG. 13 is a front view of a tool-free hard disk bracket according to the second embodiment of the present disclosure.
Figure 14:
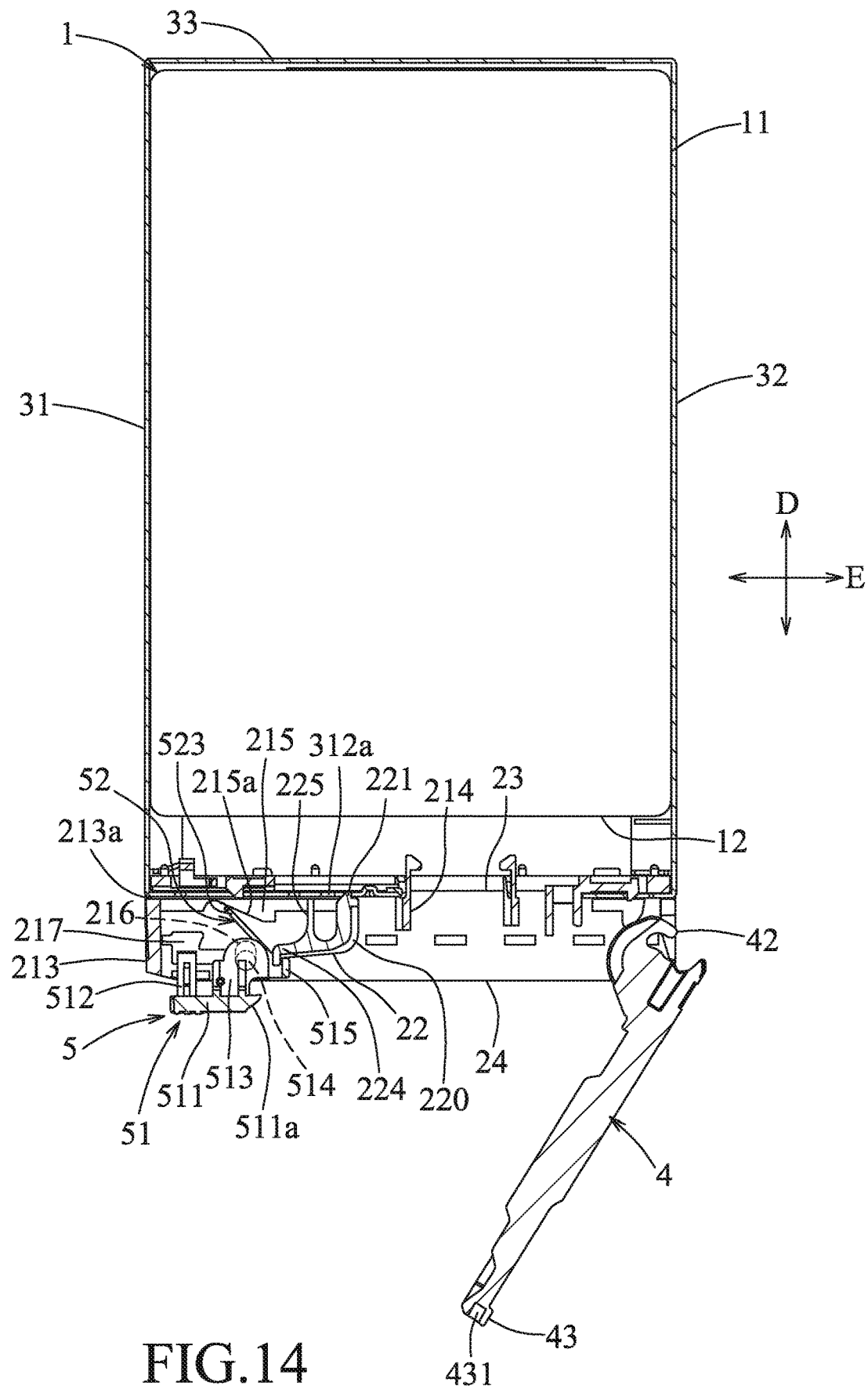
FIG. 14 is a sectional view of the second embodiment taken along line XIV-XIV of FIG. 13.
Figure 15:
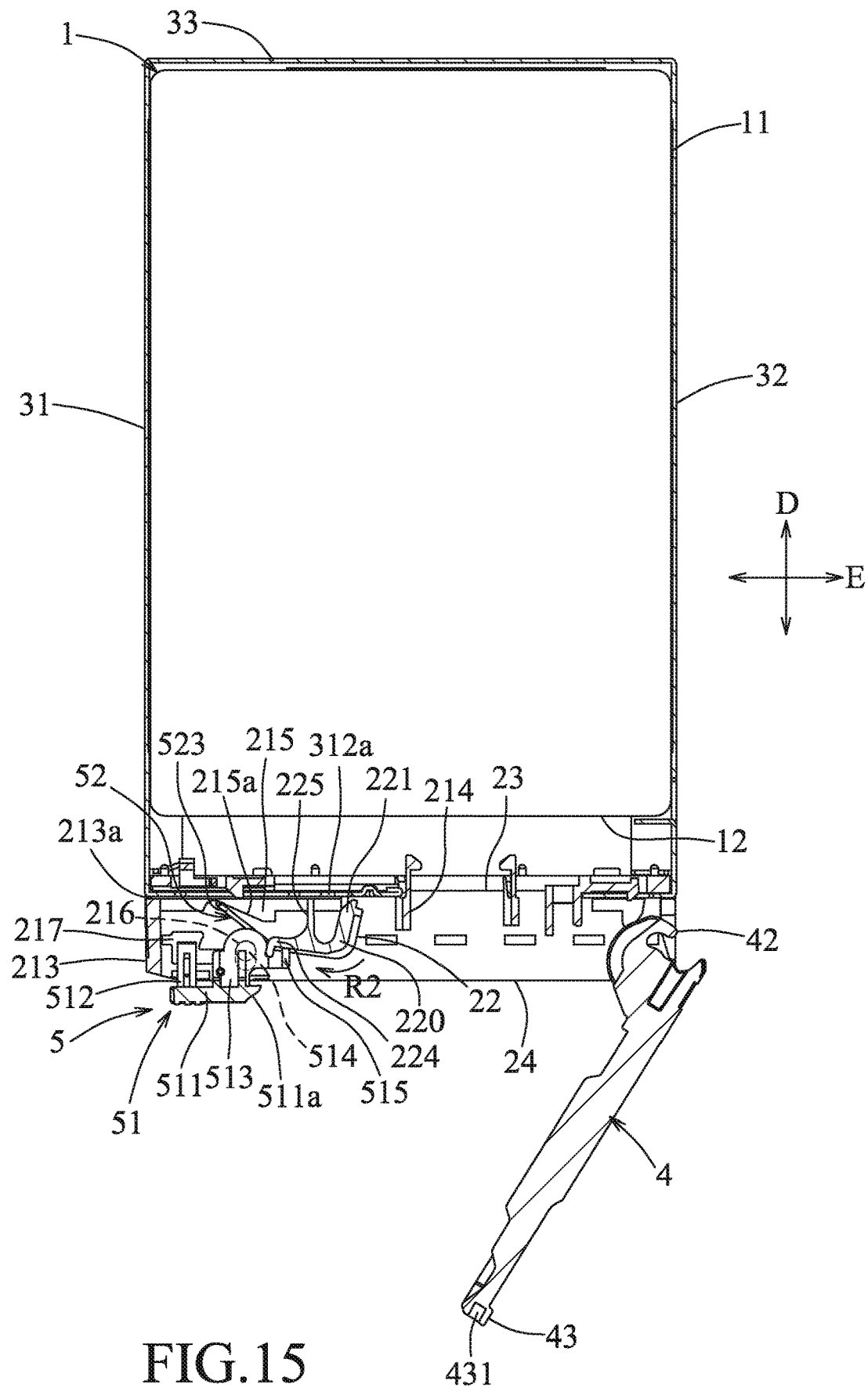
FIG. 15 is a view similar to FIG. 14 but with an operating member being moved toward an engaging member to release engagement between the engaging member and a first side arm of the frame.

Referring to FIGS. 13 to 15, the second embodiment of the tool-free hard disk bracket of this disclosure is shown to be similar to the first embodiment. However, in the second embodiment, the guide grooves 216 in the first and second main walls 211, 212 (see FIG. 2) extend in a direction perpendicular to the extending direction of the base body 21, and the engaging member 22 has a pivot portion 225 pivoted to the base body 21 and located between the stop blocks 215. The first and second arm sections 220, 224 of the engaging member 22 extend oppositely from the pivot portion 225. An abutment between the engaging member 22 and the pushing portion 515 of the operating member 51 is located between the frame 3 and the operating portion 511. The user can still press the operating portion 511 to rotate the operating unit 5 and thereby disengage the operating member 51 and the handgrip 4. However, when the user pushes the operating portion 511 to drive the rotating shaft portions 514 to move along the guide grooves 216 toward the engaging member 22, the pushing portion 515 can directly push the second arm section 224 of the engaging member 22 to move toward the first side arm 31, so that the engaging member 22 will rotate along a second pivot direction (R2) (a clockwise direction in FIG. 13) about the pivot portion 225 to separate the engaging hook 221 from the retaining slot (312a) of the first side arm 31, thereby disengaging the engaging member 22 and the first side arm 31, as shown in FIG. 12.

It should be noted that, in other embodiments, the base body 21 may not include the end wall 213, and the first and second main walls 211, 212 may rely on other structures, such as a plurality of the connecting walls 214, to provide support thereto.

In sum, by operating the operating member 51 to rotate with the rotating shaft portions 514 serving as its fulcrum and then to move along the guide grooves 216 toward the engaging member 22, the operating member 51 can simultaneously allow disengagement between the operating member 51 and the handgrip 4 and between the engaging member 22 and the first side arm 31. The first side arm 31 can move in the direction away from the base body 21 so as to increase the distance between the first and second side arms 31, 32, thereby facilitating removal of the hard disk 1 from the frame 3. Hence, operation of the tool-free hard disk bracket of this disclosure is very convenient. Therefore, the object of this disclosure can indeed be achieved.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the present disclosure has been described in connection with what are considered the most practical embodiment, it is understood that this disclosure is not limited to the disclosed embodiments but is intended to cover various arrangements included within the spirit and scope of the broadest interpretation so as to encompass all such modifications and equivalent arrangements.

What is claimed is:

1. A tool-free hard disk bracket for holding a hard disk which has two opposite lateral sides, said hard disk bracket comprising:
   a base including a base body formed with at least one guide groove, and an engaging member flexibly connected to said base body;
   a frame connected to said base for holding the hard disk and including a first side arm movably engaging with said engaging member and configured to abut against one of the lateral sides of the hard disk, and a second side arm connected to said base body and configured to abut against the other one of the lateral sides of the hard disk;
   a handgrip rotatably connected to one end of said base body and located opposite to said frame in a front-rear direction, said handgrip having a pivot end; and
   an operating unit including an operating member that is movably connected to said base body opposite to said pivot end of said handgrip and that releasably engages with said handgrip, said operating member having at least one rotating shaft portion inserted rotatably and movably into said at least one guide groove, said operating member being operated to rotate with said at least one rotating shaft portion serving as its fulcrum in a direction toward another end of said base body opposite to said one end of said base body that is connected with said handgrip to release engagement with said handgrip, and being further operated to move along said at least one guide groove toward said engaging member to push said engaging member to pivot and release engagement with said first side arm.

2. The tool-free hard disk bracket as claimed in claim 1, wherein said base body is formed with two said guide grooves, and includes a first main wall and a second main wall spaced apart from said first main wall, said guide grooves being respectively formed in said first and second main walls and corresponding in position to each other, said operating member further having an operating portion, at least one connecting portion extending from said operating portion toward said frame, two said rotating shaft portions respectively extending from said connecting portions into said respective guide grooves, and a pushing portion extending from said at least one connecting portion toward said engaging member, said operating portion being operated to move until it abuts against front edges of said first and second main walls to release engagement between said operating member and said handgrip, said rotating shaft portions being received rotatably and movably in said respective guide grooves, said operating portion being further operated to move along said guide grooves through said rotating shaft portions to drive said push portion toward said engaging member and push said engaging member to pivot so as to release engagement between said engaging member and said first side arm.

3. The tool-free hard disk bracket as claimed in claim 2, wherein each of said first and second main walls has a stop block, said stop blocks of said first and second main walls facing each other and being respectively proximate to said guide grooves, each of said stop blocks having an inclined stop face, said operating unit further including a resilient member that has two coiled portions respectively sleeved on said rotating shaft portions, and two abutment ends 523 respectively extending from said coiled portions and respectively abutting against said inclined stop faces of said stop blocks, and wherein, when said operating member is operated to abut against said front edges of said first and second main walls which are proximate to said handgrip and when said operating member is operated to move along said guide grooves toward said engaging member, said resilient member is in a compressed state to store a restoring force for restoring said operating member to its original non-operating position.

4. The tool-free hard disk bracket as claimed in claim 3, wherein said first side arm is formed with an retaining slot, said engaging member having an engaging hook extending into said retaining slot to releasably engage with said first side arm, said operating portion being operated to drive said pushing portion toward said engaging member and push said engaging member to pivot so as to move said engaging hook away from said retaining slot and release engagement between said engaging member and said first side arm.

5. The tool-free hard disk bracket as claimed in claim 2, wherein one of said first and second main walls is formed with an engaging groove proximate to from said guide groove of a corresponding one of said first and second main walls, said operating member further having at least one engaging portion extending from said operating portion toward said frame and spaced apart from said connecting portions, said at least one engaging portion engaging with said engaging groove to prevent rotation of said operating member away from said base body during operation of said operating member.

6. The tool-free hard disk bracket as claimed in claim 5, wherein each of said first and second main walls is formed with said engaging groove, said operating member having two said engaging portions respectively engaged to said engaging grooves of said first and second main walls, each of said engaging grooves having a generally L-shape and including a first hole section extending in the front-rear direction, and a second hole section extending from a front end of said first hole section toward said guide groove, said first hole sections of said engaging grooves of said first and second main walls allowing movement of said engaging portions in the front-rear direction when said operating member is operated to rotate toward said another end of said base body, said second hole sections of said first and second main walls allowing movement of said engaging portions in the left-right direction when said operating member is operated to move toward said engaging member.

7. The tool-free hard disk bracket as claimed in claim 2, wherein said base further includes a connecting wall connected between said first and second main walls, and said engaging member is flexibly connected to said connecting wall.

8. The tool-free hard disk bracket as claimed in claim 7, wherein each of said guide grooves extends in a direction similar to an extending direction of said base body, said engaging member having a first abutment surface distal to said connecting wall, said pushing portion of said operating member having a second abutment surface for abutting against said first abutment surface to allow said pushing portion to push said engaging member to pivot when said operating member is operated to move toward said engaging member so as to release engagement between said engaging member and said first side arm.

9. The tool-free hard disk bracket as claimed in claim 1, wherein said at least one guide groove is inclined with respect to an extending direction of said base body.

10. The tool-free hard disk bracket as claimed in claim 1, wherein said at least one guide groove is perpendicular to an extending direction of said base body.

11. The tool-free hard disk bracket as claimed in claim 1, wherein said first side arm is deformed when said first side arm is engaged to said engaging member, and resiliently returns to its original position when said operating member is operated to release engagement between said first side arm and said engaging member.

12. The tool-free hard disk bracket as claimed in claim 1, wherein, when said operating member is operated to release engagement between said engaging member and said first side arm, said first side arm is moved away from said base body by an external force for allowing removal of the hard disk from said frame, and resiliently returns to its original non-operating position when the external force is released.

* * * * *